US012652751B2

(12) United States Patent
Ito

(10) Patent No.: US 12,652,751 B2
(45) Date of Patent: Jun. 9, 2026

(54) RECEPTACLE ASSEMBLY AND CIRCUIT BOARD

(71) Applicant: Yamaichi Electronics Co., Ltd., Tokyo (JP)

(72) Inventor: Toshiyasu Ito, Tokyo (JP)

(73) Assignee: YAMAICHI ELECTRONICS CO., LTD., Tokyo (JP)

( * ) Notice: Subject to any disclaimer, the term of this patent is extended or adjusted under 35 U.S.C. 154(b) by 259 days.

(21) Appl. No.: 18/377,059

(22) Filed: Oct. 5, 2023

(65) Prior Publication Data

US 2025/0120007 A1 Apr. 10, 2025

(51) Int. Cl.
| | |
|---|---|
| *H05K 1/02* | (2006.01) |
| *H01R 12/73* | (2011.01) |
| *H05K 1/18* | (2026.01) |
| *H05K 1/181* | (2026.01) |

(52) U.S. Cl.
CPC ......... *H05K 1/0243* (2013.01); *H01R 12/737* (2013.01); *H05K 1/0245* (2013.01); *H05K 1/181* (2013.01); *H05K 2201/09063* (2013.01); *H05K 2201/09072* (2013.01); *H05K 2201/09409* (2013.01); *H05K 2201/10189* (2013.01); *H05K 2201/10371* (2013.01)

(58) Field of Classification Search
CPC .. H01R 12/737; H01R 12/757; H05K 1/0243; H05K 1/0245; H05K 1/181; H05K 2201/09063; H05K 2201/09072; H05K 2201/09409; H05K 2201/10189; H05K 2201/10371
USPC ...................................... 439/62, 485, 607.21
See application file for complete search history.

(56) References Cited

U.S. PATENT DOCUMENTS

| | | | | |
|---|---|---|---|---|
| 8,182,290 | B2 * | 5/2012 | Fonteneau | ........... H05K 9/0058 |
| | | | | 439/607.4 |
| 8,613,632 | B1 * | 12/2013 | Nichols | .............. H01R 13/6587 |
| | | | | 439/485 |
| 10,791,629 | B1 | 9/2020 | Ren et al. | |
| 10,971,629 | B2 * | 4/2021 | Chien | ................ H10D 30/0413 |
| 11,177,596 | B1 * | 11/2021 | Shen | .................. H01R 12/7005 |
| 2010/0284152 | A1 * | 11/2010 | Harris | .................. G02B 6/4266 |
| | | | | 361/737 |

(Continued)

FOREIGN PATENT DOCUMENTS

| | | |
|---|---|---|
| CN | 110891369 A | 3/2020 |
| CN | 211295437 U | 8/2020 |

(Continued)

OTHER PUBLICATIONS

Extended European Search Report issued Mar. 17, 2025 in EP Application No. 24202184.8.

(Continued)

*Primary Examiner* — Gary F Paumen
(74) *Attorney, Agent, or Firm* — Panitch Schwarze Belisario & Nadel LLP

(57) ABSTRACT

Provided are a receptacle assembly and a circuit board in which routing of internal layer wirings is taken into consideration. Some of the plurality of first internal layer wirings 134 are drawn toward the second electrode line L2 when viewed in the depth direction Dd, and some of the plurality of second internal layer wirings 134 are drawn toward the first electrode line L1 when viewed in the depth direction Dd.

14 Claims, 17 Drawing Sheets

(56)        References Cited

U.S. PATENT DOCUMENTS

| 2019/0115684 | A1 | 4/2019 | Khazen et al. |
| 2020/0083625 | A1 | 3/2020 | Minich |
| 2020/0358217 | A1 | 11/2020 | Takai et al. |
| 2021/0076495 | A1 | 3/2021 | Ren et al. |
| 2021/0336362 | A1 | 10/2021 | Shen et al. |
| 2023/0105368 | A1 | 4/2023 | Sharf |

FOREIGN PATENT DOCUMENTS

| CN | 114375614 A | 4/2022 |
| TW | I483019 B | 5/2015 |
| WO | 2021045965 A1 | 3/2021 |

OTHER PUBLICATIONS

Office Action issued Oct. 17, 2025 in TW Application No. 113137765.

Reissued Office Action issued Dec. 10, 2025 in TW Application No. 113137765.

* cited by examiner

RECEPTACLE ASSEMBLY AND CIRCUIT BOARD

BACKGROUND

1. Technical Field

The present invention relates to a receptacle assembly and a circuit board.

2. Description of Related Art

For example, U.S. Pat. No. 11,177,596 discloses a board end connector.

The board end connector is fixed to a circuit board when a plurality of plugging members of a housing are plugged in jacks of the circuit board.

When forming holes (openings) such as jacks in the circuit board as disclosed in U.S. Pat. No. 11,177,596, it is required to consider routing of internal layer wirings (patterns) formed in internal layers of the circuit board.

Accordingly, the present invention intends to provide a receptacle assembly and a circuit board in which routing of internal layer wirings is taken into consideration.

BRIEF SUMMARY

To achieve the above object, a receptacle assembly and a circuit board of the present invention employ the following solutions.

A receptacle assembly according to the first aspect of the present invention includes: a circuit board having a first face and a second face that is the backside of the first face; and a connector mounted on the circuit board and configured such that an external module is inserted into the connector along a first direction substantially orthogonal to the first face. When a direction orthogonal to the first direction is defined as a second direction, and a direction orthogonal to the first direction and the second direction is defined as a third direction, the connector includes a plurality of contact pins contacted to the external module and a housing holding the plurality of contact pins, the plurality of contact pins form a first pin group that includes contact pins aligned in a line along the second direction and a second pin group that includes contact pins aligned in a line along the second direction and is arranged at a distance in the third direction from the first pin group. The circuit board includes a plurality of electrodes provided to the first face, each of the contact pins being mounted on each of the electrodes and a plurality of internal layer wirings formed in an internal layer between the first face and the second face and connected to each of the electrodes through a via, the plurality of electrodes form a first electrode line that includes a plurality of electrodes aligned in a line along the second direction and on which the contact pins which are included in the first pin group are mounted and a second electrode line that includes a plurality of electrodes aligned in a line along the second direction and is arranged at a distance in the third direction from the first electrode line and on which the contact pins which are included in the second pin group are mounted, the plurality of internal layer wirings include a plurality of first internal layer wirings connected to the plurality of electrodes included in the first electrode line and a plurality of second internal layer wirings connected to the plurality of electrodes included in the second electrode line, some of the plurality of first internal layer wirings are drawn toward the second electrode line when viewed in the first direction, and some of the plurality of second internal layer wirings are drawn toward the first electrode line when viewed in the first direction.

According to the receptacle assembly of the present aspect, because some internal layer wirings are purposely drawn to a region between the first electrode line and the second electrode line, the number of internal layer wirings which have to be drawn to the outer region can be reduced. Accordingly, the area used for providing an opening or the like can be ensured in the outer region.

In the receptacle assembly according to the second aspect of the present invention dependent on first aspect, the plurality of contact pins form a third pin group that includes contact pins aligned in a line along the second direction and a fourth pin group that includes contact pins aligned in a line along the second direction and is arranged at a distance in the third direction from the third pin group, the plurality of electrodes form a third electrode line that includes electrodes aligned in a line along the second direction and on which the contact pins which are included in the third pin group are mounted and a fourth electrode line that includes electrodes aligned in a line along the second direction and is arranged at a distance in the third direction from the third electrode line and on which the contact pins which are included in the fourth pin group are mounted, and the first electrode line and the second electrode line are arranged between the third electrode line and the fourth electrode line in the third direction.

According to the receptacle assembly of the present aspect, the third electrode line and the fourth electrode line can be provided in the outer region.

In the receptacle assembly according to the third aspect of the present invention dependent on first aspect, the connector includes a plurality of protruding parts fixed to the housing and protruding in the first direction, the circuit board includes a plurality of through-holes formed so as to penetrate from the first face to the second face, the protruding parts being inserted in the plurality of through-holes, the through-holes are arranged on extension lines in the second direction of the first electrode line and/or the second electrode line.

According to the receptacle assembly of the present aspect, the internal layer wirings can be drawn without interference with the through-holes.

In the receptacle assembly according to the fourth aspect of the present invention dependent on second aspect, the connector includes a plurality of protruding parts fixed to the housing and protruding in the first direction, the circuit board includes a plurality of through-holes formed so as to penetrate from the first face to the second face, the protruding parts being inserted in the plurality of through-holes, and the through-holes are arranged on extension lines in the second direction of the first electrode line or the third electrode line and of the second electrode line or the fourth electrode line.

According to the receptacle assembly of the present aspect, the internal layer wirings can be drawn without interference with the through-holes.

In the receptacle assembly according to the fifth aspect of the present invention dependent on any one of the first aspect to the fourth aspect, the first internal layer wirings are drawn for each pair of the electrodes adjacent to each other in the second direction, and the second internal layer wirings are drawn for each pair of the electrodes adjacent to each other in the second direction.

According to the receptacle assembly of the present aspect, the internal layer wirings can be drawn for respective electrode pads associated with each pair (differential pair) of high-speed signals adjacent to each other.

In the receptacle assembly according to the sixth aspect of the present invention dependent on any one of the first aspect to the fifth aspect, in the circuit board, a distance along the first direction from the electrodes to the first internal layer wirings is a distance at which the electrodes and the first internal layer wirings are not electrically coupled to each other, and a distance along the first direction from the electrodes to the second internal layer wirings is a distance at which the electrodes and the second internal layer wirings are not electrically coupled to each other.

According to the receptacle assembly of the present aspect, it is possible to suppress a stub from occurring in an overlapping portion between an electrode and an internal layer wiring and thus improve transmission characteristics.

In the receptacle assembly according to the seventh aspect of the present invention dependent on sixth aspect, the distance along the first direction from the electrodes to the first internal layer wirings is 0.5 mm or greater, and the distance along the first direction from the electrodes to the second internal layer wirings is 0.5 mm or greater.

According to the receptacle assembly of the present aspect, it is possible to suppress a stub from occurring in an overlapping portion between an electrode and an internal layer wiring and thus improve transmission characteristics.

In the receptacle assembly according to the eighth aspect of the present invention dependent on any one of the first aspect to the seventh aspect, the circuit board includes a through-opening formed so as to penetrate from the first face to the second face, and the through-opening extends in the second direction to be parallel to the first electrode line and/or the second electrode line in a region in which the internal layer wirings are not formed.

According to the receptacle assembly of the present aspect, a large opening area of the through-openings can be ensured, and this enables smooth guidance of air that has passed through the heat sink to the external space.

In the receptacle assembly according to the ninth aspect of the present invention dependent on the eighth aspect, the through-opening is formed in a region on a side away from the second electrode line with respect to the first electrode line in the third direction and/or a region on a side away from the first electrode line with respect to the second electrode line in the third direction.

According to the receptacle assembly of the present aspect, a large opening area of the through-openings can be ensured, and this enables smooth guidance of air that has passed through the heat sink to the external space.

In the receptacle assembly according to the tenth aspect of the present invention dependent on any one of the first aspect to the ninth aspect, the housing of the connector includes a protrusion protruding in the first direction, the circuit board includes a recess, the protrusion being fitted into the recess, the through-holes of the circuit board include a through-hole arranged beside the first electrode line along the second direction and a through-hole arranged beside the second electrode line along the second direction, and the recess of the circuit board is arranged between, in the third direction, the through-hole arranged beside the first electrode line and the through-hole arranged beside the second electrode line.

According to the receptacle assembly of the present aspect, the protrusion of the housing is fitted into the recess of the circuit board, and thereby the connector can be positioned at a predetermined position.

In the receptacle assembly according to the eleventh aspect of the present invention dependent on any one of the first aspect to the tenth aspect, the connector includes a metal shell covering the housing, a plurality of protruding parts are formed to the shell and fixed by soldering while inserted in the through holes, the housing includes a step on the outer circumferential face, and an edge facing the circuit board of the shell is in contact with the step of the housing.

According to the receptacle assembly of the present aspect, the housing is pressed by the shell, and motion in a direction away from the circuit board along the first direction is restricted. This improves durability of the connector against insertion and extraction of the external module.

The receptacle assembly according to the twelfth aspect of the present invention dependent on any one of the first aspect to the eleventh aspect, includes a plurality of cages, at least one port to house the external module is defined in each of the cages, and the cages are each fixed to the circuit board with the connector mounted on the circuit board being housed in the cage and are arranged with a spacing from each other in at least one of the second direction and the third direction.

According to the receptacle assembly of the present aspect, with a spacing being provided between the cages, regions in which neither the cages nor the connectors associated with the cages are mounted are present in the circuit board between the cages. Thus, these regions of the circuit board can be used for routing of the internal layer wirings. It is therefore possible to shorten internal layer wirings used for connection from the connector associated with each cage to the ASIC and thus improve transmission characteristics.

The circuit board according to the thirteenth aspect of the present invention is a circuit board configured such that an external connector having a plurality of contact pins is mounted on the circuit board and an external module is inserted into the external connector along a first direction. When a direction orthogonal to the first direction is defined as a second direction, and a direction orthogonal to the first direction and the second direction is defined as a third direction, the circuit board includes: a plurality of electrodes provided to a first face, each of the contact pins being mounted on each of the electrodes; and a plurality of internal layer wirings formed in an internal layer between the first face and a second face, which is the backside of the first face, and connected to each of the electrodes through a via, the plurality of electrodes form a first electrode line including electrodes aligned in a line along the second direction and a second electrode line including electrodes aligned in a line along the second direction and arranged at a distance in the third direction from the first electrode line, the plurality of internal layer wirings include a plurality of first internal layer wirings connected to the plurality of electrodes included in the first electrode line and a plurality of second internal layer wirings connected to the plurality of electrodes included in the second electrode line, some of the plurality of first internal layer wirings are drawn toward the second electrode line when viewed in the first direction, and some of the plurality of second internal layer wirings are drawn toward the first electrode line when viewed in the first direction.

BRIEF DESCRIPTION OF THE SEVERAL VIEWS OF THE DRAWINGS

FIG. 11 is a front view illustrating the arrangement of cages.

FIG. 13 is a front view illustrating the arrangement of the cages as a comparative example.

DETAILED DESCRIPTION

Receptacle assemblies according to a first embodiment and a second embodiment of the present invention will be described below with reference to the drawings.

Note that, when a direction in which an optical module is inserted/extracted is defined as an insertion-extraction direction Die, a depth direction Dd (first direction) matches the insertion-extraction direction Die, a width direction Dw (second direction) is orthogonal to the depth direction Dd, and a height direction Dh (third direction) is orthogonal to the depth direction Dd and the width direction Dw.

However, the insertion-extraction direction Die, the depth direction Dd, the width direction Dw, and the height direction Dh are intended to assist in understanding the description and not intended to limit actual postures or positions.

Further, in a cage assembly and each component or each element forming the cage assembly, a portion/part, an end, an edge, and a face which are close to a circuit board are referred to as "rear part", "rear end", "rear edge", and "rear/rear face", respectively, and a portion/part, an end, an edge, and a face which are far from the circuit board are referred to as "front part", "front end", "front edge", and "front/front face", respectively.

First Embodiment

<Basic Configuration>

Figure 1:
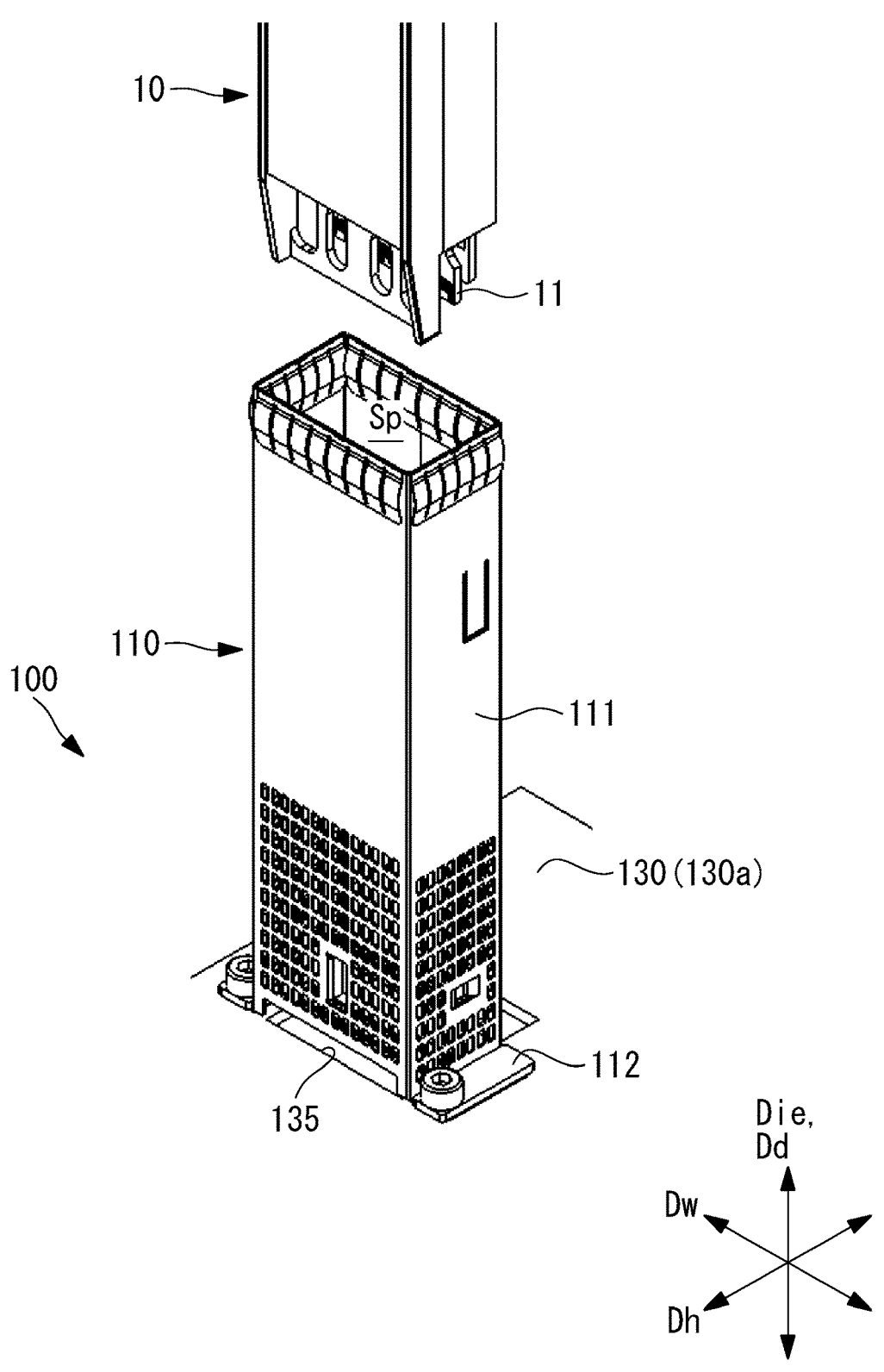
FIG. 1 is a perspective view of a receptacle assembly and an optical module according to a first embodiment (with the optical module extracted).
Figure 2:
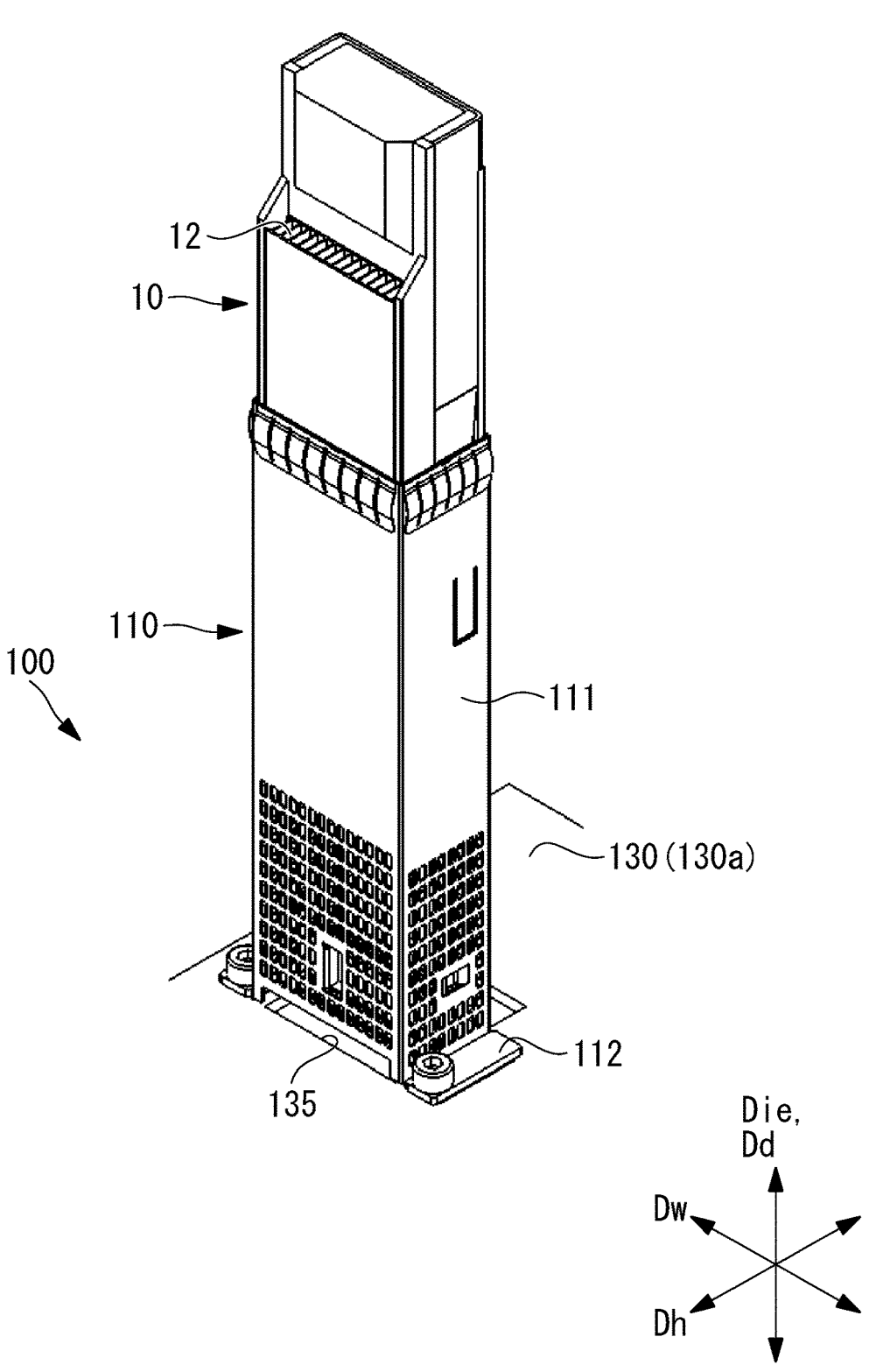
FIG. 2 is a perspective view of the receptacle assembly and the optical module according to the first embodiment (with the optical module inserted).

As illustrated in FIG. 1 and FIG. 2, a receptacle assembly 100 is a device to which an optical module 10 (external module) is connected. The optical module 10 is a module complied with a form factor of QSFP-DD, OSFP, OSFP-XD, or the like, for example.

Figure 3:
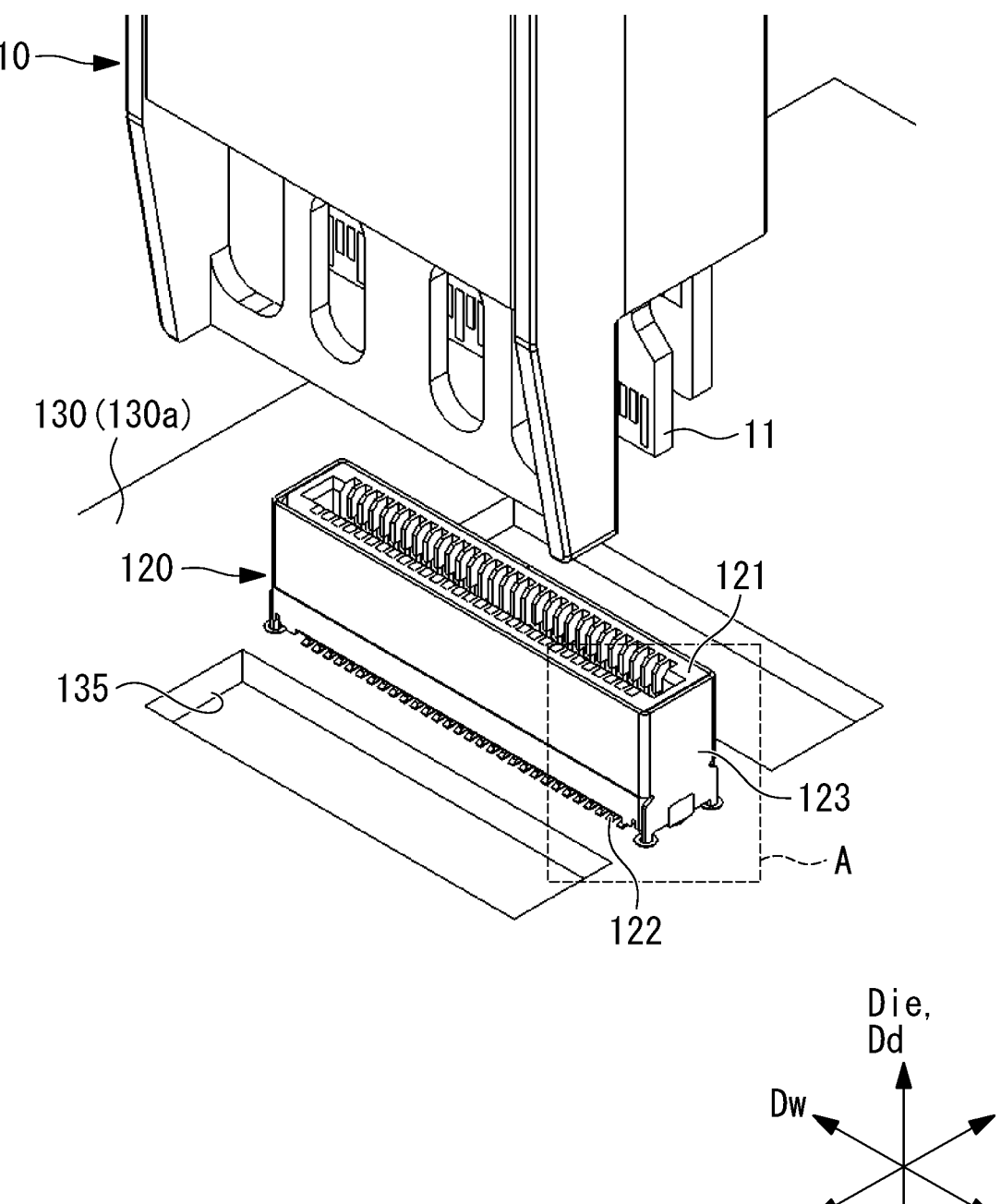
FIG. 3 is a perspective view of the receptacle assembly (cage omitted) and the optical module according to the first embodiment.

As illustrated in FIG. 1, FIG. 2, and FIG. 3, the receptacle assembly 100 includes a cage 110, a connector 120, and a circuit board 130.

As illustrated in FIG. 2, the cage 110 is a component in which the connector 120 and the optical module 10 are housed and is fixed to a first face 130a that is a front side of the circuit board 130.

Figure 10:
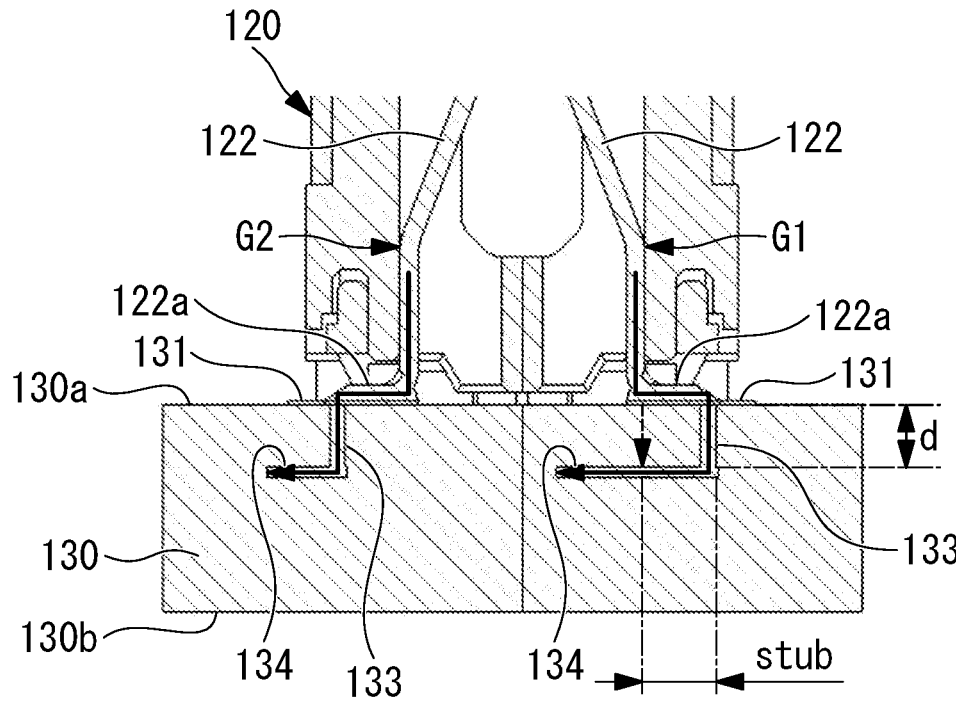
FIG. 10 is a partial sectional view of the receptacle assembly according to the first embodiment (a face orthogonal to the width direction is the cut face).
Figure 10:
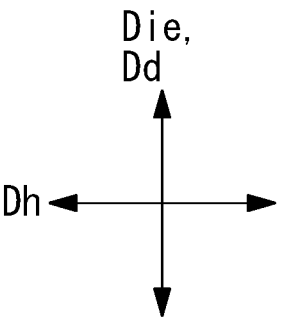

Note that the backside of the circuit board 130 is a second face 130b (see FIG. 10).

As illustrated in FIG. 1 and FIG. 2, the cage 110 has a cylindrical body 111 and flanges 112. The cylindrical body 111 is a rectangular cylindrical portion including four walls and defines a space (port Sp) in which the connector 120 and the optical module 10 are housed.

The base ends of two walls opposed in the width direction Dw out of the four walls included in the cylindrical body 111 are provided with the flanges 112, respectively. A fastening member such as a screw or a bolt is inserted into each flange 112. The inserted fastening member is fastened by being screwed into a threaded screw hole formed in a backplate (not illustrated) provided to the second face 130b of the circuit board 130 or by being inserted through a through-hole formed in the backplate to clamp the circuit board 130 and the backplate between the fastening member and a nut (not illustrated). Accordingly, the cage 110 is fixed to the circuit board 130.

Figure 4:
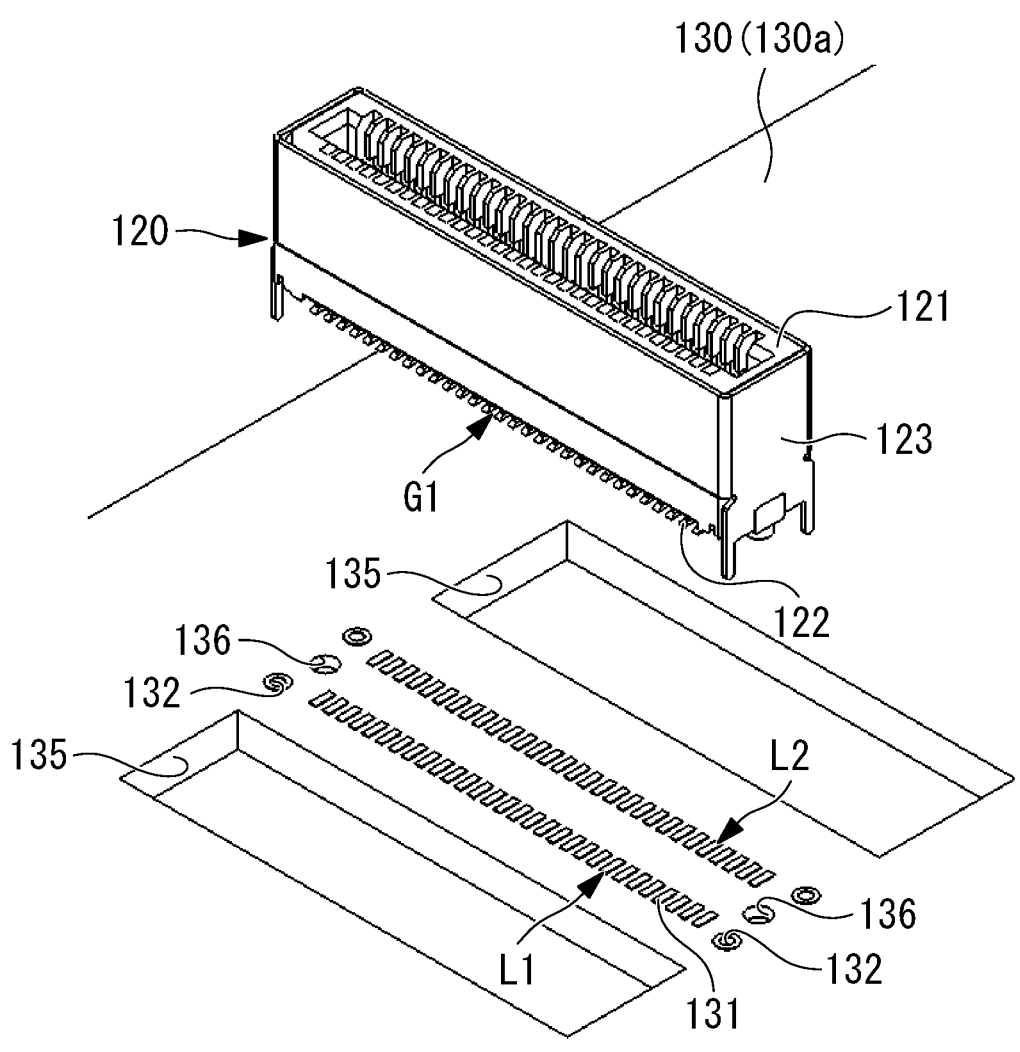
FIG. 4 is an exploded perspective view of the receptacle assembly (cage omitted) according to the first embodiment.
Figure 4:
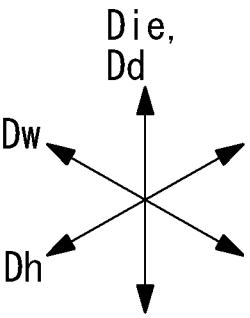

As illustrated in FIG. 3 and FIG. 4, the connector 120 is a component into which a module board 11 of the optical module 10 is inserted, and the connector 120 is fixed to the first face 130a of the circuit board 130.

The connector 120 is electrically connected to the circuit board 130 and has a relaying function between the module board 11 and the circuit board 130.

Figure 5:
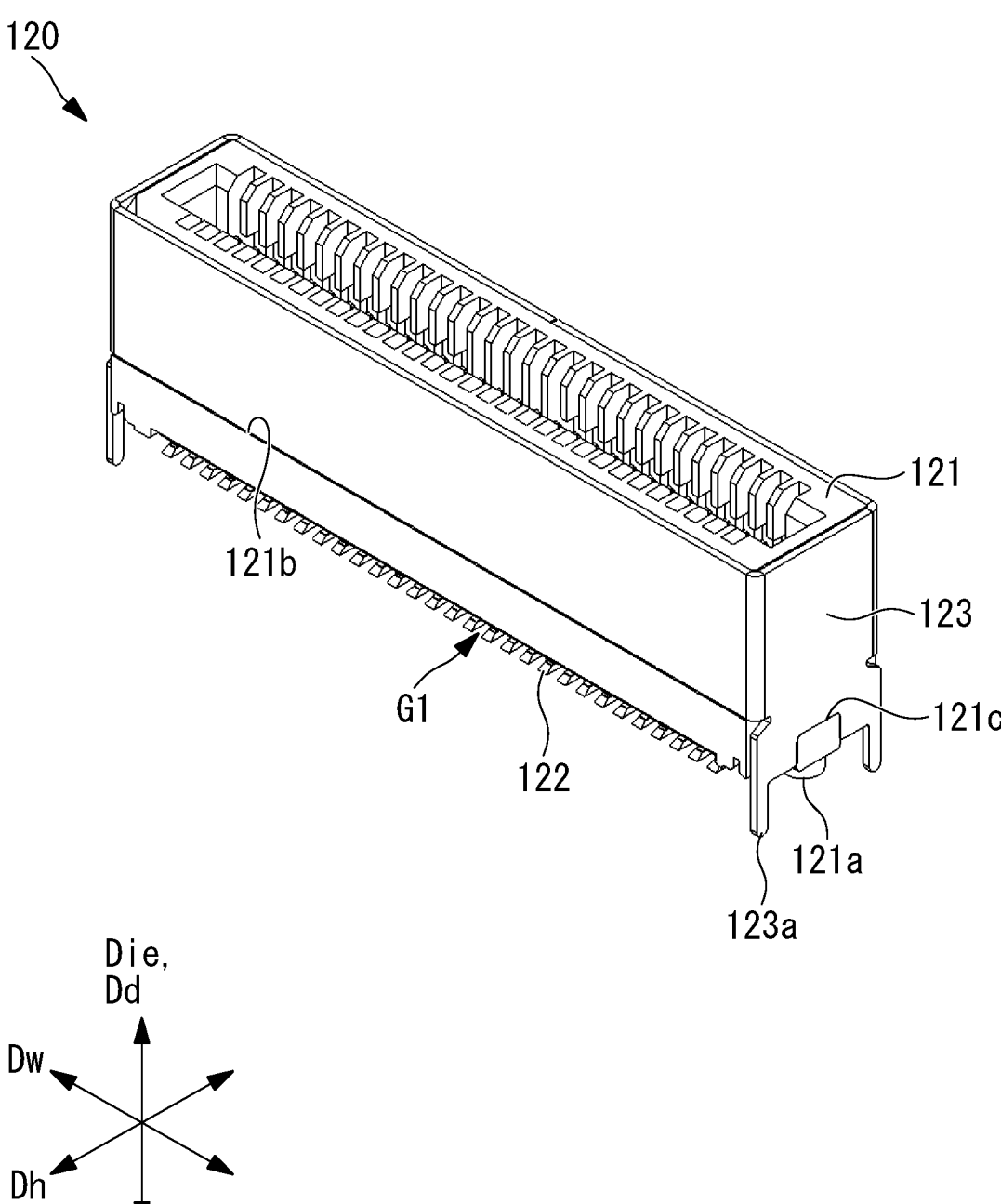
FIG. 5 is a perspective view of a connector according to the first embodiment.
Figure 6:
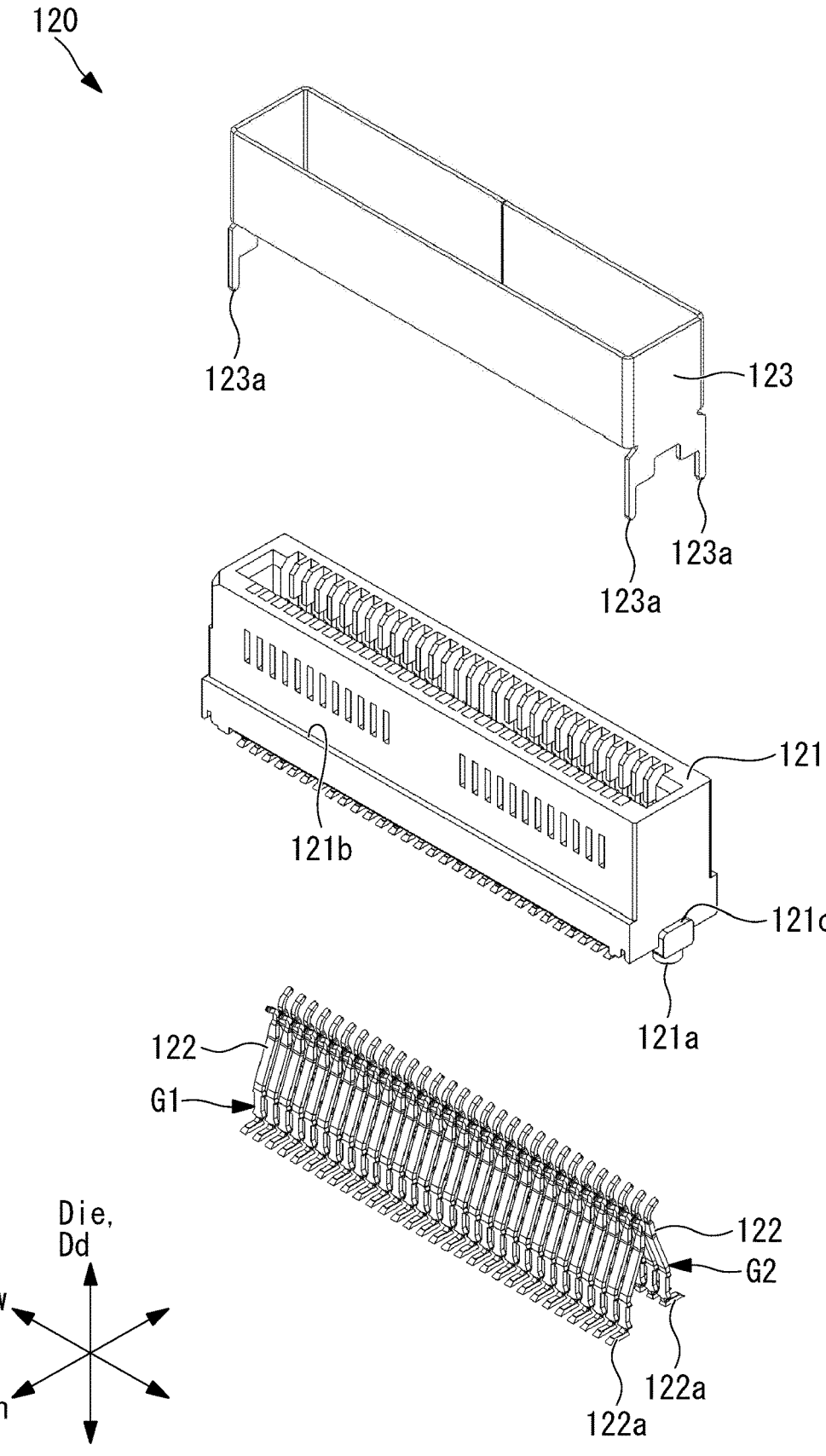
FIG. 6 is an exploded perspective view of the connector according to the first embodiment.

As illustrated in FIG. 5 and FIG. 6, the connector 120 has a housing 121, a plurality of contact pins 122, and a shell 123.

The housing 121 is a substantially rectangular parallelepiped component that holds the plurality of contact pins 122 and is insulating.

Each of the plurality of contact pins 122 is an elongated component having electrical conductivity. The plurality of contact pins 122 form a first pin group G1 and a second pin group G2. The first pin group G1 is a group (a unit) in which some contact pins 122 are aligned in a line at a constant pitch along the width direction Dw. On the other hand, the second pin group G2 is a group (a unit) in which the remaining contact pins 122 are aligned in a line at a constant pitch along the width direction Dw and is arranged at a distance in the height direction Dh from the first pin group G1.

The shell 123 is a portion fitted onto the housing 121 so as to cover the circumference of the housing 121 and is made of metal. For example, the shell 123 is formed of a thin plate having a predetermined shape and bent into a rectangular cylindrical shape. The rear end of the shell 123 is provided with a plurality of protruding terminals 123a (protruding parts). Each protruding terminal 123a is an elongated portion protruding in the depth direction Dd toward the circuit board 130.

Figure 7:
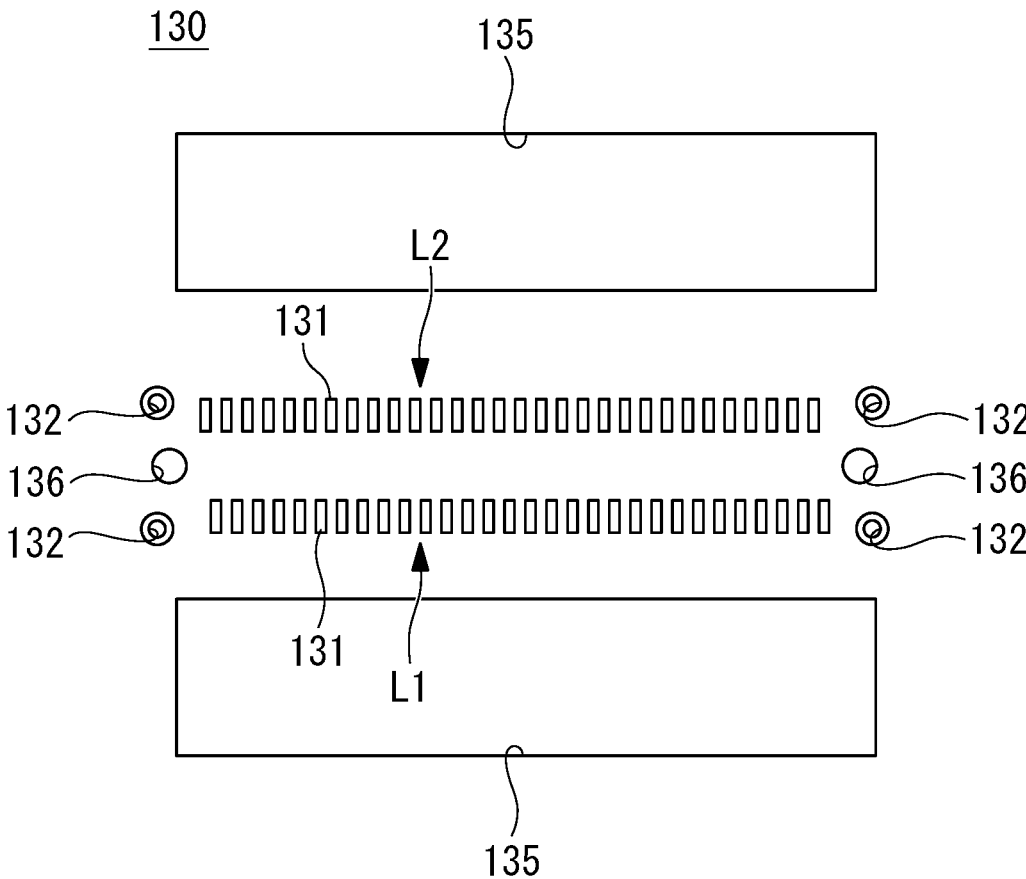
FIG. 7 is a plan view of a surface layer of a circuit board according to the first embodiment.
Figure 7:
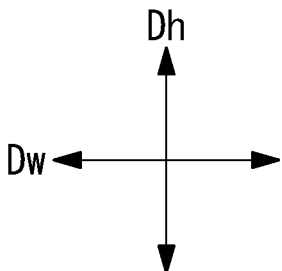

As illustrated in FIG. 4 and FIG. 7, the circuit board 130 is a component on which the connector 120 is mounted, and an ASIC is arranged on the second face 130b of the circuit board 130.

As illustrated in FIG. 7, the circuit board 130 has a plurality of electrode pads 131. Further, a plurality of through-holes 132 are formed in the circuit board 130.

The electrode pads 131 are portions to which mount parts 122a of the contact pins 122 of the connector 120 are connected, respectively.

The electrode pads 131 are associated with the contact pins 122 in a one-to-one manner. Thus, the plurality of electrode pads 131 form a first electrode line L1 corresponding to the first pin group G1 and a second electrode line L2 corresponding to the second pin group G2.

The first electrode line L1 is a group (a unit) in which some electrode pads 131 are aligned in a line at a constant pitch along the width direction Dw. On the other hand, the second electrode line L2 is a group (a unit) in which the remaining electrode pads 131 are aligned in a line at a constant pitch along the width direction Dw and is arranged at a distance in the height direction Dh from the first electrode line L1.

Figure 8:
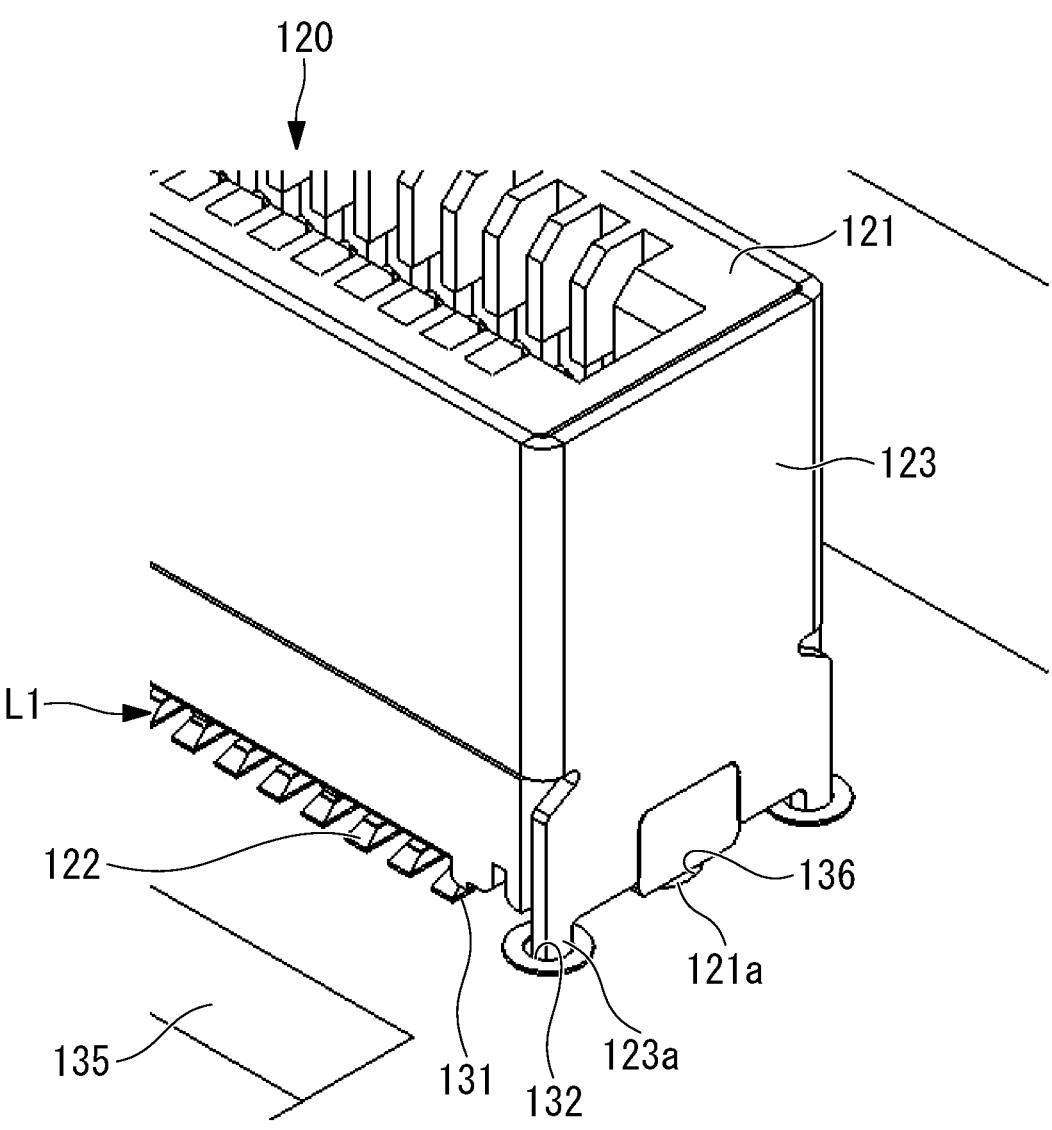
FIG. 8 is a partial enlarged view of the part A of FIG. 3.
Figure 8:
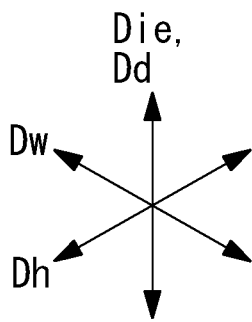

Each of the through-holes 132 is a hole into which the protruding terminal 123a of the shell 123 of the connector 120 is inserted (see FIG. 8).

The inner circumferential face of the through-hole 132 is plated.

The number of through-holes 132 corresponds to the number of protruding terminals 123a. As illustrated in FIG. 7, the number of through-holes 132 is four in the case of the present embodiment.

Two of four through-holes 132 are arranged beside the first electrode line L1 on both sides in the width direction Dw. In other words, the two through-holes 132 are arranged on an extension line of the first electrode line L1 in the width direction Dw. The remaining two through-holes 132 are arranged beside the second electrode line L2 on both sides in the width direction Dw. In other words, the two through-holes 132 are arranged on an extension line of the second electrode line L2 in the width direction Dw.

When the connector 120 is mounted on the circuit board 130, solder cream is printed on lands of the through-holes 132 in advance, a target component is heated by using a heating device such as a reflow furnace with the protruding terminals 123a of the connector 120 being inserted in the through-holes 132, and thereby the solder cream flows into the through-holes 132. The target component is then cooled, and thereby the protruding terminals 123a are soldered to the through-holes 132.

Further, when the connector 120 is mounted on the circuit board 130, solder cream is printed on the electrode pads 131 in advance, a target component is heated by using a heating device such as a reflow furnace with the mount parts 122a of the contact pin 122 being placed on the electrode pads 131, the target component is then cooled, and thereby the mount parts 122a (the contact pins 122) are soldered to the electrode pads 131.

As set forth, the connector 120 is mounted on the circuit board 130.

Figure 9:
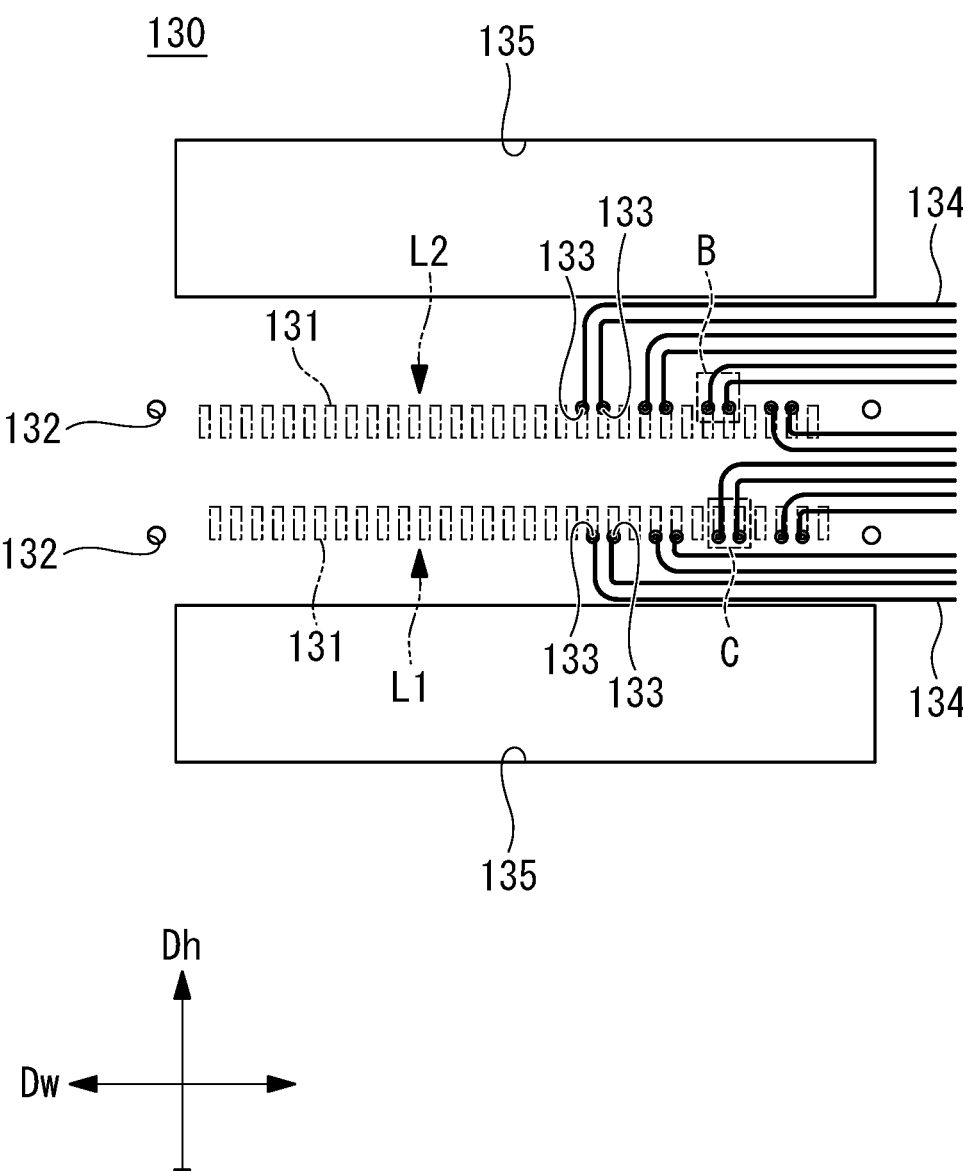
FIG. 9 is a plan view of an internal layer of the circuit board according to the first embodiment.

As illustrated in FIG. 9, the circuit board 130 further has patterns 134 (internal layer wirings).

The patterns 134 are provided in a layer (internal layer) present between the first face 130a and the second face 130b and, as illustrated in FIG. 10, are connected to the electrode pads 131 through vias 133 extending in the thickness direction of the circuit board 130. Note that the thickness direction of the circuit board 130 matches the depth direction Dd. As illustrated in FIG. 9, the patterns 134 are drawn for respective electrode pads 131 associated with each pair (differential pair) of high-speed signal lines adjacent to each other, for example.

In the patterns 134 (first internal layer wirings) connected to the first electrode line L1, when viewed in the depth direction Dd, some of the pairs of the patterns 134 drawn on a differential pair basis are drawn toward the second electrode line L2, then change the direction by approximately 90 degrees, and extend in the width direction Dw. On the other hand, when viewed in the depth direction Dd, the remaining of the pairs of the patterns 134 drawn on a differential pair basis are drawn toward the opposite side to the side where the second electrode line L2 is located, then change the direction by approximately 90 degrees, and extend in the width direction Dw.

In the patterns 134 (second internal layer wirings) connected to the second electrode line L2, when viewed in the depth direction Dd, some of the pairs of the patterns 134 drawn on a differential pair basis are drawn toward the first electrode line L1, then change the direction by approximately 90 degrees, and extend in the width direction Dw. On the other hand, when viewed in the depth direction Dd, the remaining of the pairs of the patterns 134 drawn on a differential pair basis are drawn toward the opposite side to the side where the first electrode line L1 is located, then change the direction by approximately 90 degrees, and extend in the width direction Dw.

Because the patterns 134 are drawn as described above, the patterns 134 do not interfere with the through-holes 132 on substantially the same straight line as the first electrode line L1 and the second electrode line L2.

Further, because some patterns 134 are purposely drawn to a region between the first electrode line L1 and the second electrode line L2 (hereafter, referred to as "inner region"), the number of patterns 134 which have to be drawn to the outer region can be reduced. Accordingly, the area used for providing an opening or the like can be ensured in the outer region. Herein, the outer region refers to a region on the side away from the second electrode line L2 with respect to the first electrode line L1 in the height direction Dh and a region on the side away from the first electrode line L1 with respect to the second electrode line L2 in the height direction Dh. In short, the outer region refers to regions outside the inner region in the height direction Dh.

For example, through-openings 135 are formed in the outer regions of the circuit board 130.

Each of the through-openings 135 is a rectangular opening extending in the width direction Dw to be parallel to the first electrode line L1 and the second electrode line L2 and penetrates the circuit board 130 from the first face 130a to the second face 130b.

The through-openings 135 are openings for guiding air that has passed through a heat sink 12 (see FIG. 2), which removes heat from the optical module 10, to the external space adjacent to the second face 130b.

As described above, since a large area of the outer regions is ensured by the sophisticated way of drawing of the patterns 134, a large opening area of the through-openings 135 can be also ensured, and this enables smooth guidance of air that has passed through the heat sink 12 to the external space.

As illustrated in FIG. 10, the patterns 134 are connected to the electrode pads 131 through the vias 133.

In this state, the distance d in the thickness direction of the circuit board 130 from the underside of the electrode pads 131 to the top side of the patterns 134 is a distance at which the electrode pad 131 and the pattern 134 are not electrically coupled to each other without routed through the via 133 (a distance at which the electrode pad 131 and the pattern 134 are not directly electrically coupled to each other). As a specific example, the distance d is 0.5 mm or greater, preferably 0.7 mm or greater.

With a certain length or longer of the distance d being ensured in such a way, occurrence of a stub is prevented.

Herein, the stub will be described.

In FIG. 10, the solid line arrows represent flows of normal electrical signals. The broken line arrow represents a flow of an electrical signal when the electrode pads 131 are electrically coupled to the patterns 134 without routed through the vias 133.

First, a set of the mount part 122a of the contact pin 122, the electrode pad 131, the via 133, and the pattern 134 on the left side in FIG. 10 corresponding to the part B illustrated in FIG. 9 will be described. The via 133 is connected to a portion of the electrode pad 131 near the end of the mount part 122a extending toward the outer region. Further, the pattern 134 extends in the same direction as the extending direction of the mount part 122a. Thus, the direction of current flowing in the mount part 122a or the electrode pad 131 is the same as the direction of an electrical signal flowing in the pattern 134 (a portion near the start end of the pattern 134 in a strict sense).

Next, a set of the mount part 122a of the contact pin 122, the electrode pad 131, the via 133, and the pattern 134 on the right side in FIG. 10 corresponding to the part C illustrated in FIG. 9 will be described. The via 133 is connected to a portion of the electrode pad 131 near the end of the mount part 122a extending toward the outer region. Further, the pattern 134 extends in the opposite direction to the extending direction of the mount part 122a. Thus, the direction of current flowing in the mount part 122a or the electrode pad 131 is the opposite to the direction of an electrical signal flowing in the pattern 134 (a portion near the start end of the pattern 134 in a strict sense), and the mount part 122a or the electrode pad 131 overlap the pattern 134 when viewed in the depth direction Dd.

Herein, if the electrode pads 131 were electrically coupled to the patterns 134 without routed through the vias 133 (see the broken line arrow), the mount part 122a, the electrode pad 131, the via 133, a portion of the pattern 134 overlapping the mount part 122a, or a portion of the pattern 134 overlapping the electrode pad 131 would be a stub.

<Positioning of Connector>

As illustrated in FIG. 6, the housing 121 is provided with a plurality of protrusions 121a.

The protrusions 121a are portions protruding toward the circuit board 130 and are provided under the housing 121 on both sides in the width direction Dw.

In the case of FIG. 6, the shape of the protrusion 121a is circularly columnar. However, the shape of the protrusion 121a is not limited to a circular column but may be any shape other than the circular column (for example, a rectangular column).

On the other hand, as illustrated in FIG. 4 and FIG. 7, the circuit board 130 is provided with a plurality of recesses 136.

The recesses 136 are depressions into which the protrusions 121a provided to the housing 121 are fitted. Thus, the shape of each recess 136 is adapted to the shape of the protrusion 121a.

The depth of the recess 136 is a dimension such that the recess 136 does not reach the pattern 134.

Each recess 136 is arranged between, in the height direction Dh, each through-hole 132 beside the first electrode line L1 and each through-hole 132 beside the second electrode line L2.

As illustrated in FIG. 8, the protrusions 121a of the housing 121 are fitted into the recesses 136 of the circuit board 130 when the connector 120 is placed on the first face 130a of the circuit board 130, and thereby the connector 120 is positioned at a predetermined position.

The "predetermined position" as used herein is a position at which each protruding terminal 123a of the shell 123 is inserted into each through-hole 132 of the circuit board 130 and the mount part 122a of each contact pin 122 comes into contact with each electrode pad 131 of the circuit board 130.

<Step of Connector>

As illustrated in FIG. 6, side faces of the housing 121 of the connector 120 are provided with steps 121b and steps 121c.

Each of the steps 121b is a portion protruding/a portion expanding outward from a part of one of two side faces of the housing 121 that are orthogonal to the height direction Dh and has an upward face orthogonal to the depth direction Dd.

Each of the steps 121c is a portion protruding/a portion expanding outward from a part of one of two side faces of the housing 121 that are orthogonal to the width direction Dw and has an upward face orthogonal to the depth direction Dd.

As illustrated in FIG. 5, some parts of edges of the shell 123 facing the circuit board 130 come into contact with the faces of the step 121b and the faces of the step 121c.

As illustrated in FIG. 8, since the shell 123 is fixed to the through-holes 132 of the circuit board 130 by the protruding terminals 123a, the housing 121 is pressed by the shell 123, and motion in a direction away from the circuit board 130 along the depth direction Dd is restricted. This improves durability of the connector 120 against insertion and extraction of the optical module 10.

<Arrangement of Cage>

In the cage 110 of FIG. 1, a single port Sp is defined.

Figure 11:
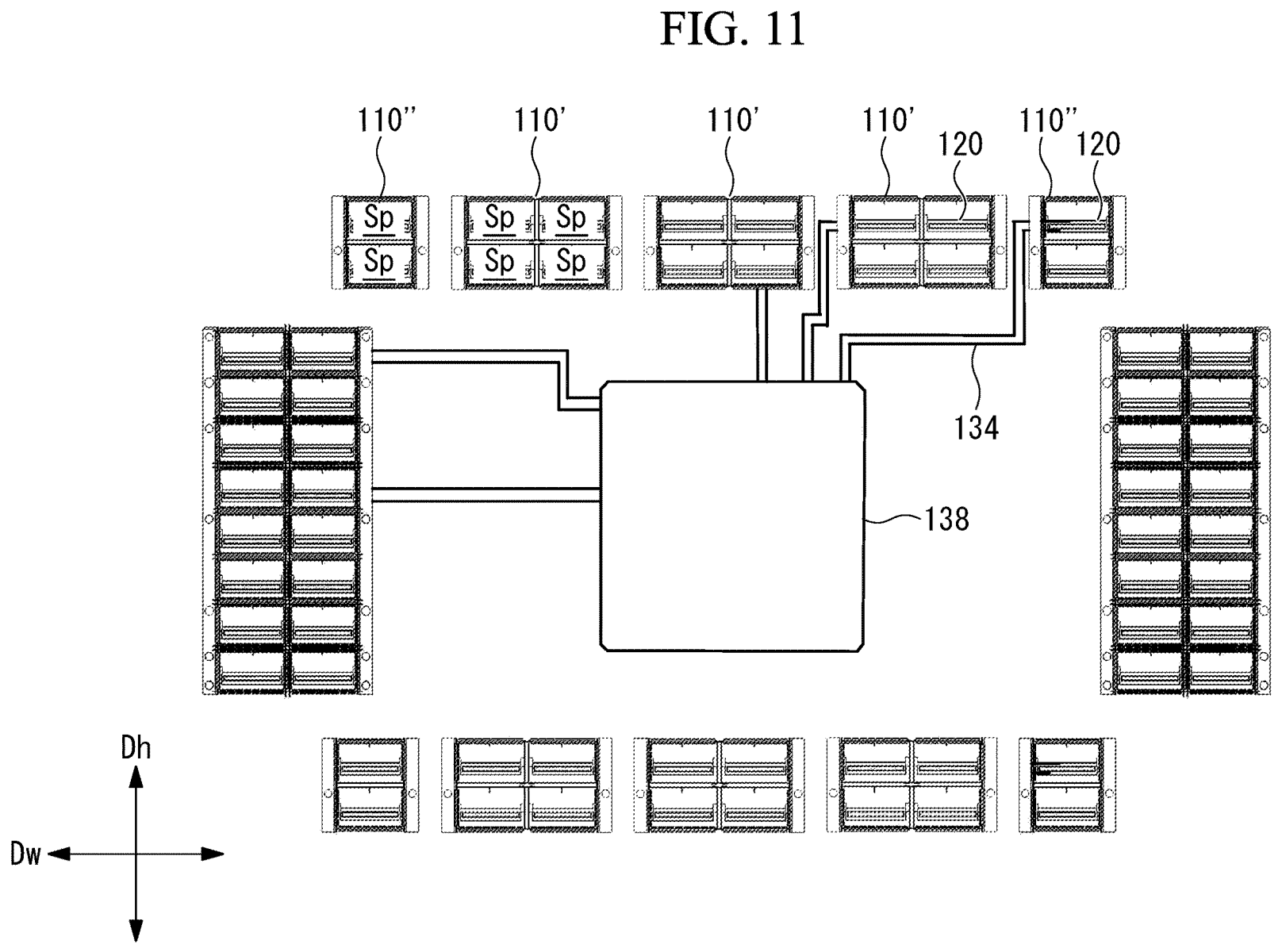

However, the form of the cage 110 is not limited thereto and may be a form in which 2×2 ports Sp are defined as with cages 110' or may be a form in which 2×1 ports Sp are defined as with cages 110'', for example, as illustrated in the upper part and the lower part in FIG. 11.

In the case of FIG. 11, the cages 110' and the cages 110'' fixed to the first face 130a of the circuit board 130 are arranged along the width direction Dw in the upper part and the lower part of an ASIC 138 arranged on the second face 130b of the circuit board 130 when the circuit board 130 is viewed from front.

Figure 12:
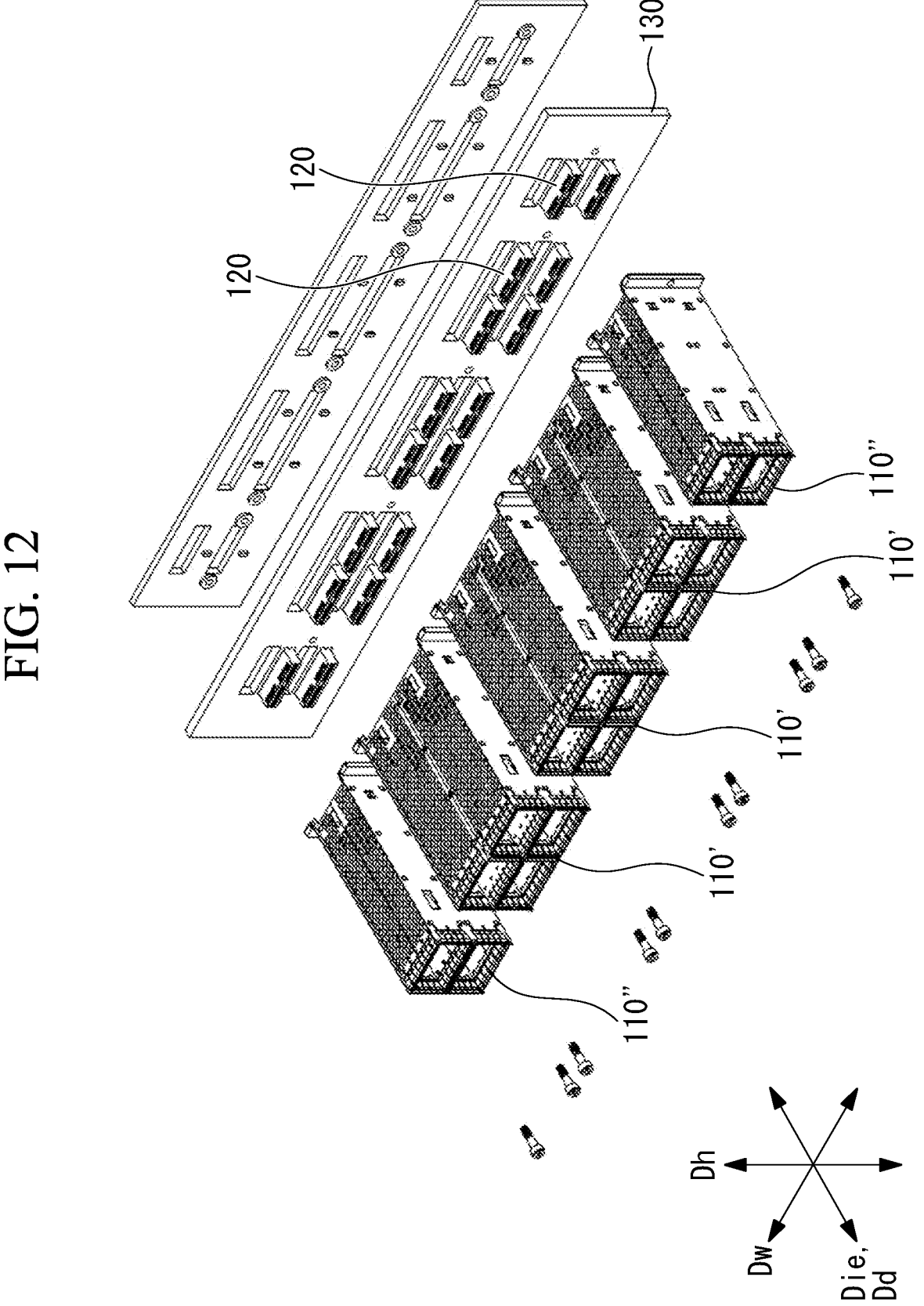
FIG. 12 is an exploded perspective view illustrating the arrangement of the cages.

Specifically, as illustrated in FIG. 11 and FIG. 12, the plurality of cages 110' are arranged with a spacing from each other along the width direction Dw, and the two cages 110'' are arranged with spacings from the cages 110' to both sides of a set of the plurality of cages 110'.

The reason for providing spacings in the width direction Dw between the cages 110' and between the cage 110' and the cage 110'' is as follows.

That is, for example, with a spacing being provided between the cages 110', regions in which neither the cages 110' nor the connectors 120 attached to the cages 110' are mounted are present in the circuit board 130 between the cages 110'. Thus, these regions of the circuit board 130 can be used for routing of the patterns 134. It is therefore possible to shorten the patterns 134 used for connection from the connector 120 attached to each cage 110' to the ASIC 138 and thus improve transmission characteristics. The same applies to the spacing between the cage 110' and the cage 110".

Figure 13:
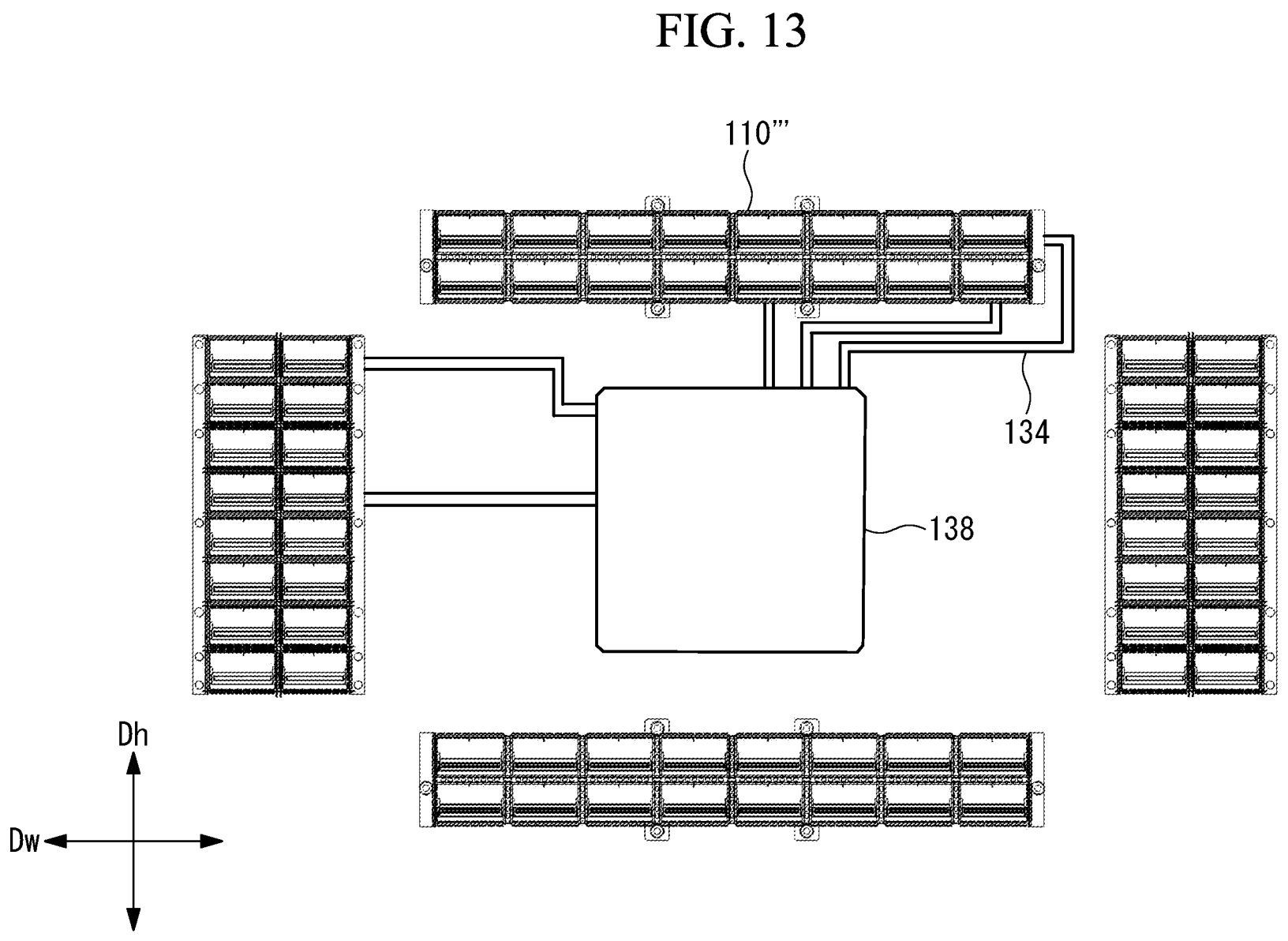

If no spacing is present between the cages 110' or between the cage 110' and the cage 110", as illustrated in FIG. 13 as a comparative example, it is required to route the patterns 134 by using regions of the circuit board 130 on the outer circumference of an integrated cage 110"", and this results in longer patterns 134 than in the form of FIG. 11 and others.

Note that a similar spacing may be provided in the height direction Dh.

Further, the number of ports defined by a cage is not limited to the above, and other cages such as, for example, a cage in which 2×2 ports are defined or a cage in which 2×4 ports are defined may be used. In such a case, the cages in which 2×2 ports are defined are arranged with spacings from both sides of the cages in which 2×4 ports are defined.

Second Embodiment

The present embodiment differs from the first embodiment in the form of the connector 120 and the circuit board 130 and is the same as the first embodiment in other respects.

Thus, the same configuration is labeled with a reference having a different hundred digit, and the description thereof will be omitted.

Figure 14:
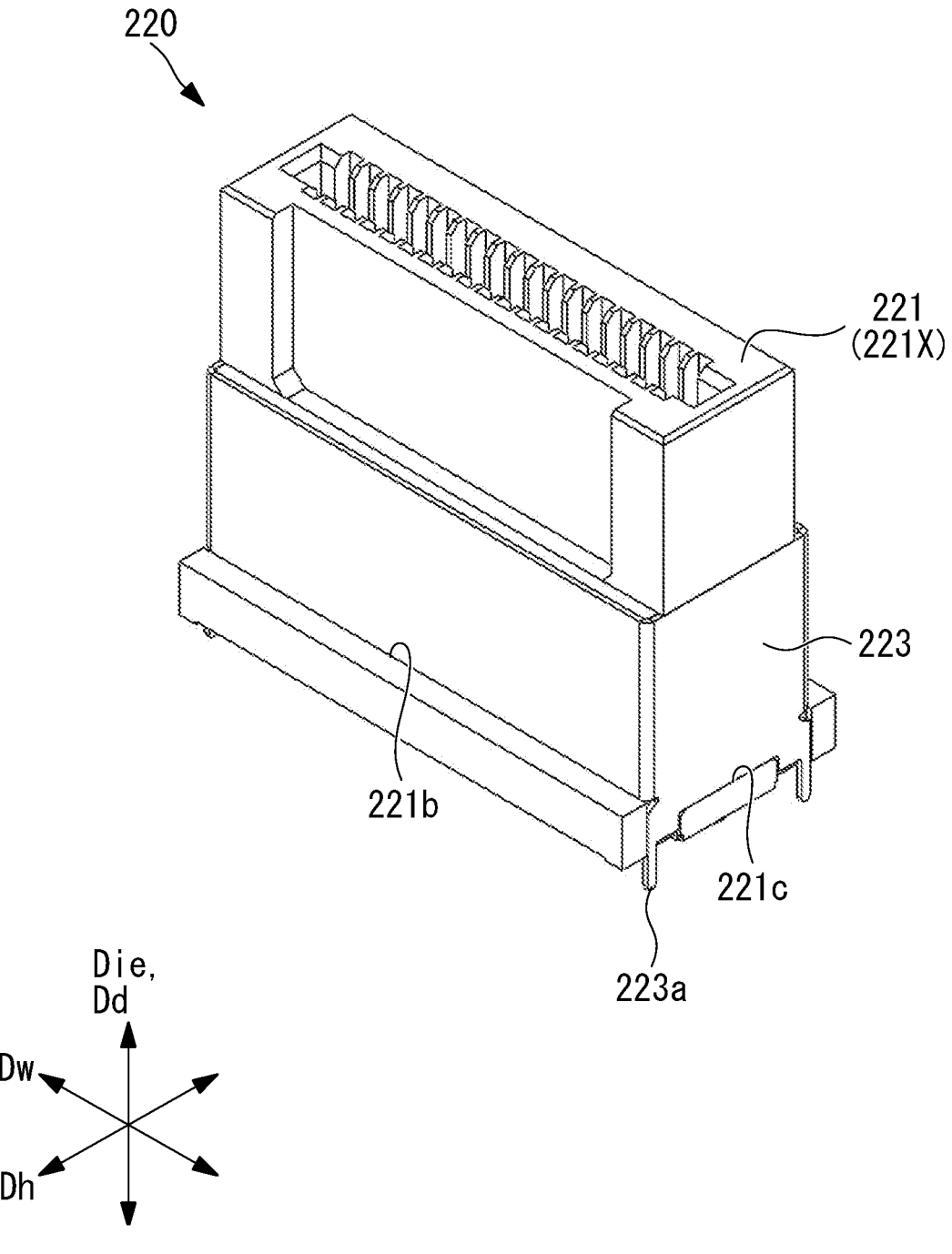
FIG. 14 is a perspective view of a connector according to a second embodiment.
Figure 15:
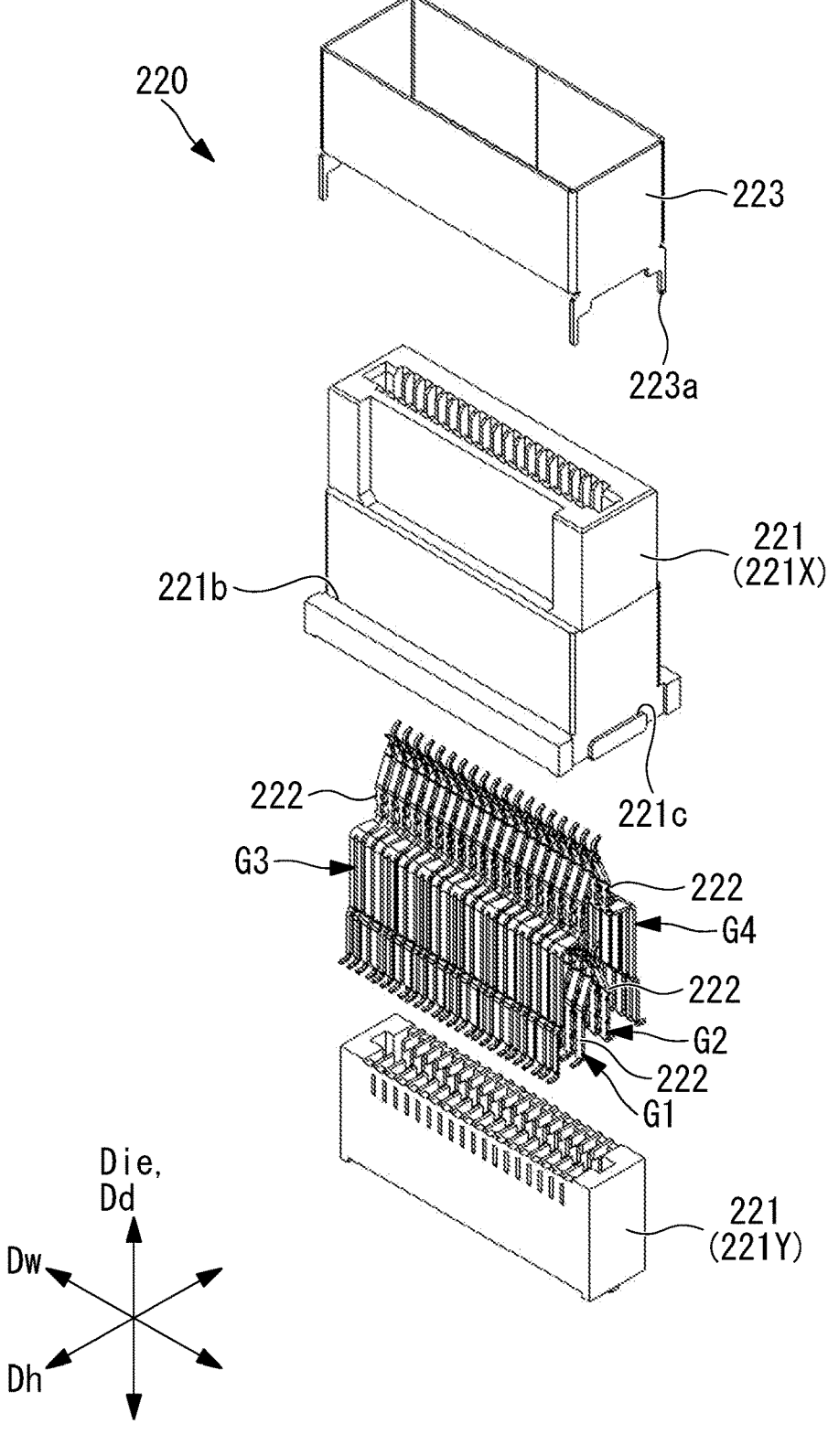
FIG. 15 is an exploded perspective view of the connector according to the second embodiment.

As illustrated in FIG. 14 and FIG. 15, a connector 220 has a housing 221, a plurality of contact pins 222, and a shell 223.

The housing 221 includes an outer housing 221X and an inner housing 221Y and holds the plurality of contact pins 222. Note that steps 221*b* and steps 221*c* are provided on the side faces of the outer housing 221X.

The plurality of contact pins 222 form a third pin group G3 and a fourth pin group G4 held by the outer housing 221X in addition to the first pin group G1 and the second pin group G2 held by the inner housing 221Y. The third pin group G3 is a group (a unit) in which some contact pins 222 are aligned in a line at a constant pitch along the width direction Dw. On the other hand, the fourth pin group G4 is a group (a unit) in which some contact pins 222 are aligned in a line at a constant pitch along the width direction Dw.

The third pin group G3 and the fourth pin group G4 are arranged outside the first pin group G1 and the second pin group G2.

In other words, the first pin group G1 and the second pin group G2 are arranged so as to be interposed between the third pin group G3 and the fourth pin group G4 in the height direction Dh.

Figure 16:
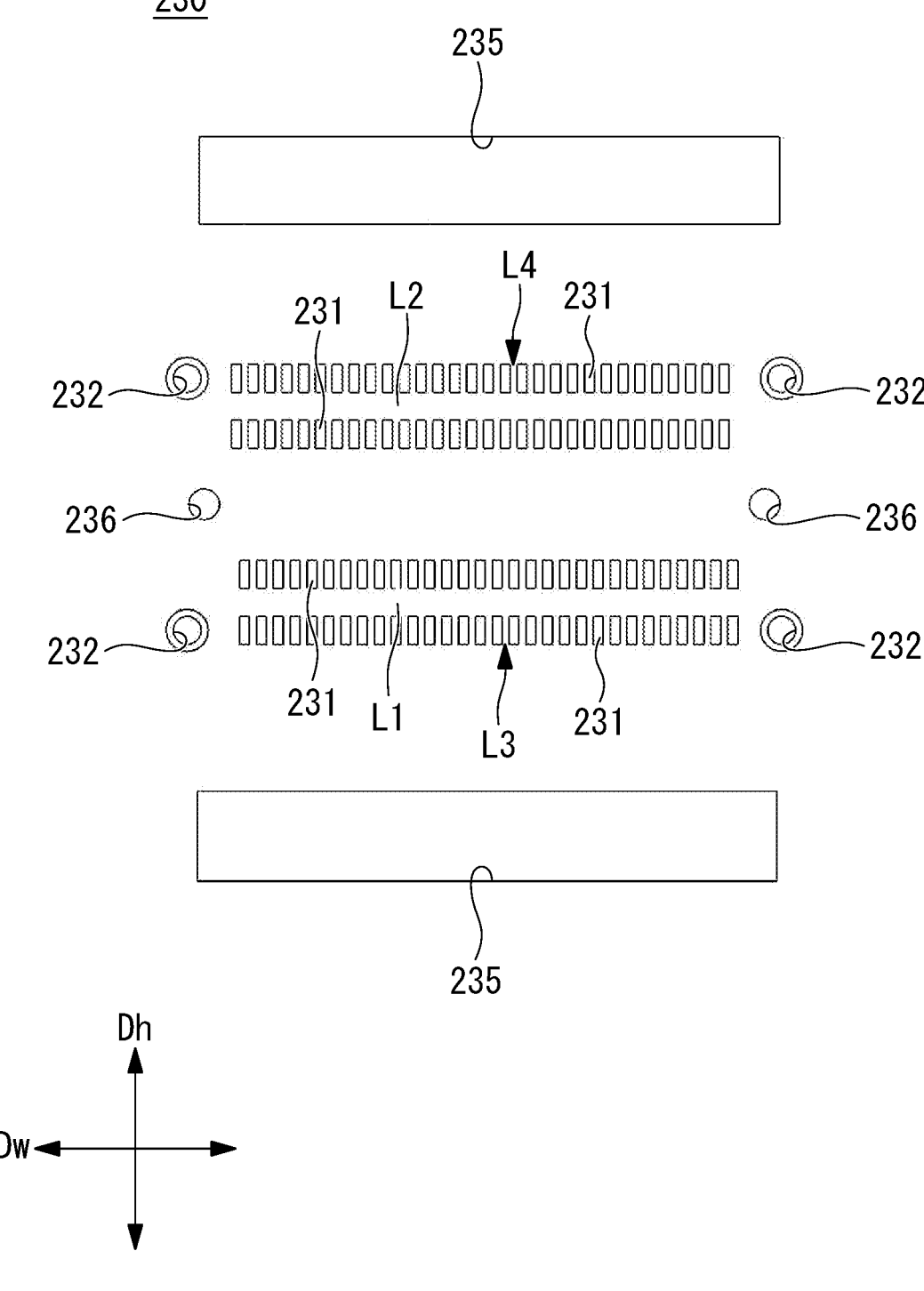
FIG. 16 is a plan view of a surface layer of a circuit board according to the second embodiment.
Figure 17:
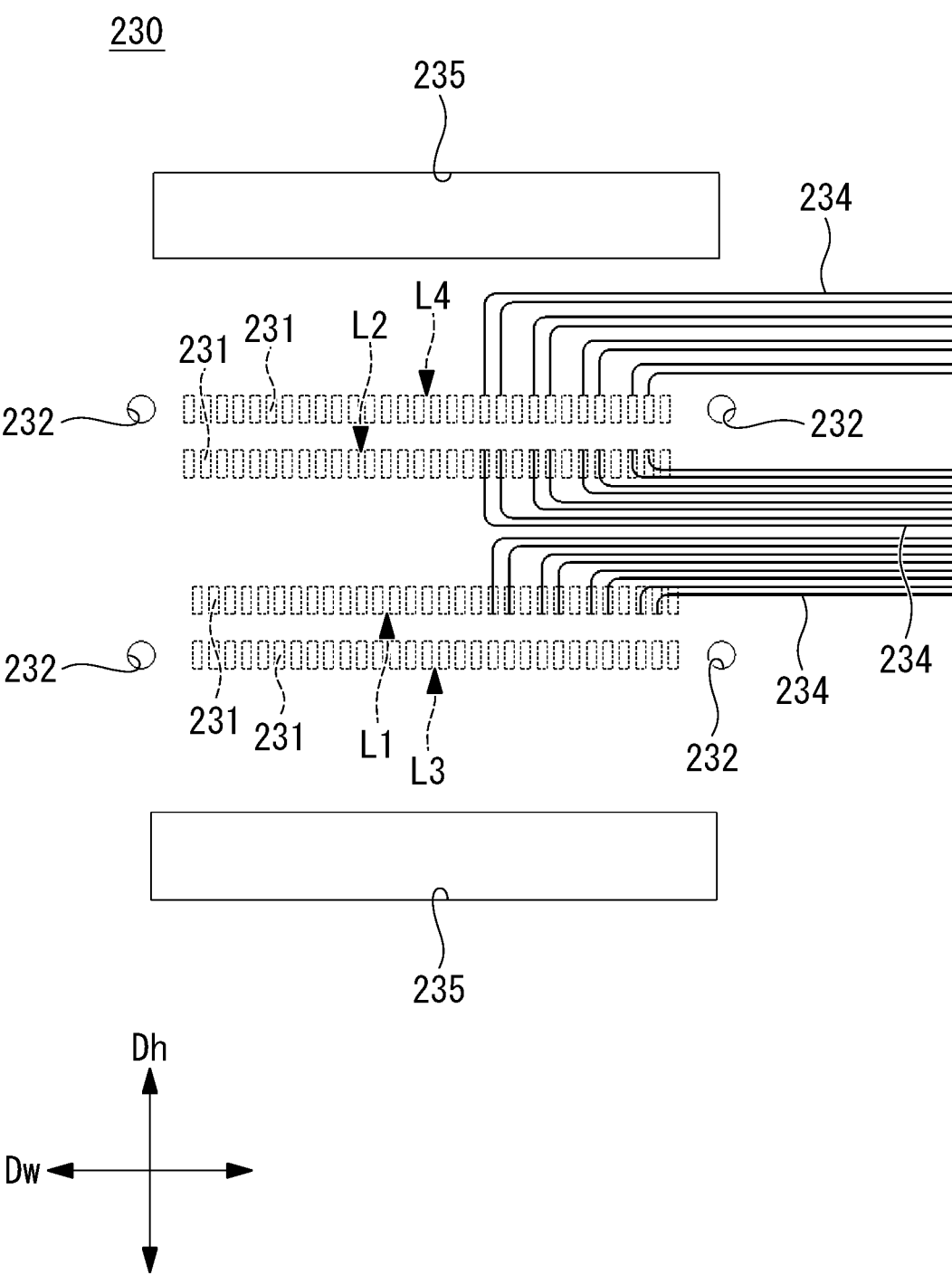
FIG. 17 is a plan view of an internal layer of the circuit board according to the second embodiment.

As illustrated in FIG. 16 and FIG. 17, the plurality of electrode pads 231 form a third electrode line L3 corresponding to the third pin group G3 and a fourth electrode line L4 corresponding to the fourth pin group G4, in addition to the first electrode line L1 corresponding to the first pin group G1 and the second electrode line L2 corresponding to the second pin group G2.

The third electrode line L3 is a group (a unit) in which some electrode pads 231 are aligned in a line at a constant pitch along the width direction Dw. The fourth electrode line L4 is a group (a unit) in which some electrode pads 231 are aligned in a line at a constant pitch along the width direction Dw.

The third electrode line L3 and the fourth electrode line L4 are arranged in the outer regions outside the first electrode line L1 and the second electrode line L2.

In other words, the first electrode line L1 and the second electrode line L2 are arranged in the inner region inside the third electrode line L3 and the fourth electrode line L4. Two of four through-holes 232 are arranged beside the first electrode line L1 or the third electrode line L3 on both sides in the width direction Dw. In other words, the two through-holes 232 are arranged on the extension line in the width direction Dw of the first electrode line L1 or the third electrode line L3. Note that, in FIG. 16 and FIG. 17, the two through-holes 232 are arranged on the extension line of the third electrode line L3.

The remaining two through-holes 232 are arranged beside the second electrode line L2 or the fourth electrode line L4 on both sides in the width direction Dw. In other words, the two through-holes 232 are arranged on the extension line in the width direction Dw of the second electrode line L2 or the fourth electrode line L4. Note that, in FIG. 16 and FIG. 17, the two through-holes 232 are arranged on the extension line of the fourth electrode line L4.

In the patterns 234 connected to the first electrode line L1, when viewed in the depth direction Dd, pairs of the patterns 234 drawn on a differential pair basis are drawn toward the second electrode line L2, then change the direction by approximately 90 degrees, and extend in the width direction Dw.

In the patterns 234 connected to the second electrode line L2, when viewed in the depth direction Dd, the pairs of the patterns 234 drawn on a differential pair basis are drawn toward the first electrode line L1, then change the direction by approximately 90 degrees, and extend in the width direction Dw.

Because the patterns 234 are purposely drawn to the inner region between the first electrode line L1 and the second electrode line L2 in such a way, the area used for providing through-openings 235 or the third electrode line L3 and the fourth electrode line L4 can be ensured in the outer region.

LIST OF REFERENCE SYMBOLS

10 optical module (external module)
11 module board (external module board)
12 heat sink
100 receptacle assembly
110, 110', 110" cage
111 cylindrical body
112 flange
120 connector
121 housing
121*a* protrusion
121*b* step
121*c* step
122 contact pin
122*a* mount part
123 shell
123*a* protruding terminal (protruding part)
130 circuit board
130*a* first face
130*b* second face
131 electrode pad
132 through-hole
133 via
134 pattern (internal layer wiring)
135 through-opening
136 recess
138 ASIC
220 connector
221 housing
221X outer housing
221Y inner housing

13

221b step
221c step
222 contact pin
223 shell
223a protruding terminal (protruding part)
230 circuit board
231 electrode pad
232 through-hole
234 pattern (internal layer wiring)
235 through-opening
236 recess
G1 first pin group
G2 second pin group
G3 third pin group
G4 fourth pin group
L1 first electrode line
L2 second electrode line
L3 third electrode line
L4 fourth electrode line

What is claimed is:

1. A receptacle assembly comprising:
a circuit board having a first face and a second face that is the backside of the first face; and
a connector mounted on the circuit board and configured such that an external module is inserted into the connector along a first direction substantially orthogonal to the first face,
wherein when a direction orthogonal to the first direction is defined as a second direction, and a direction orthogonal to the first direction and the second direction is defined as a third direction, the connector includes
a plurality of contact pins contacted to the external module, and
a housing holding the plurality of contact pins,
wherein the plurality of contact pins form a first pin group that includes contact pins aligned in a line along the second direction and a second pin group that includes contact pins aligned in a line along the second direction and is arranged at a distance in the third direction from the first pin group, and
wherein the circuit board includes
a plurality of electrodes provided to the first face, each of the contact pins being mounted on each of the electrodes, and
a plurality of internal layer wirings formed in an internal layer between the first face and the second face and connected to each of the electrodes through a via,
wherein the plurality of electrodes form a first electrode line that includes a plurality of electrodes aligned in a line along the second direction and on which the contact pins included in the first pin group are mounted and a second electrode line that includes a plurality of electrodes aligned in a line along the second direction and is arranged at a distance in the third direction from the first electrode line and on which the contact pins included in the second pin group are mounted,
wherein the plurality of internal layer wirings include a plurality of first internal layer wirings connected to the plurality of electrodes included in the first electrode line and a plurality of second internal layer wirings connected to the plurality of electrodes included in the second electrode line,
wherein some of the plurality of first internal layer wirings are drawn toward the second electrode line when viewed in the first direction, and

wherein some of the plurality of second internal layer wirings are drawn toward the first electrode line when viewed in the first direction,
wherein the circuit board includes a through-opening formed so as to penetrate from the first face to the second face,
wherein the through-opening is a hole for guiding air that has passed through a heat sink which removes heat from the external module and flows along the first direction to an external space adjacent to the second face,
wherein the through-opening extends in the second direction to be parallel to the first electrode line and/or the second electrode line in a region in which the internal layer wirings are not formed.

2. The receptacle assembly according to claim 1,
wherein the plurality of contact pins form a third pin group that includes contact pins aligned in a line along the second direction and a fourth pin group that includes contact pins aligned in a line along the second direction and is arranged at a distance in the third direction from the third pin group,
wherein the plurality of electrodes form a third electrode line that includes electrodes aligned in a line along the second direction and on which the contact pins included in the third pin group are mounted and a fourth electrode line that includes electrodes aligned in a line along the second direction and is arranged at a distance in the third direction from the third electrode line and on which the contact pins included in the fourth pin group are mounted, and
wherein the first electrode line and the second electrode line are arranged between the third electrode line and the fourth electrode line in the third direction.

3. The receptacle assembly according to claim 1,
wherein the connector includes a plurality of protruding parts fixed to the housing and protruding in the first direction, and
wherein the circuit board includes a plurality of through-holes formed so as to penetrate from the first face to the second face, the protruding parts being inserted in the plurality of through-holes,
wherein the through-holes are arranged on extension lines in the second direction of the first electrode line and the second electrode line.

4. The receptacle assembly according to claim 2,
wherein the connector includes a plurality of protruding parts fixed to the housing and protruding in the first direction, and
wherein the circuit board includes a plurality of through-holes formed so as to penetrate from the first face to the second face, the protruding parts being inserted in the plurality of through-holes,
wherein the through-holes are arranged on extension lines in the second direction of the first electrode line or the third electrode line and of the second electrode line or the fourth electrode line.

5. The receptacle assembly according to claim 1,
wherein the first internal layer wirings are drawn for each pair of the electrodes adjacent to each other in the second direction, and
wherein the second internal layer wirings are drawn for each pair of the electrodes adjacent to each other in the second direction.

6. The receptacle assembly according to claim 1,
wherein in the circuit board,
a distance along the first direction from the electrodes to
the first internal layer wirings is a distance at which the
electrodes and the first internal layer wirings are not
electrically coupled to each other, and
a distance along the first direction from the electrodes to
the second internal layer wirings is a distance at which
the electrodes and the second internal layer wirings are
not electrically coupled to each other.

7. The receptacle assembly according to claim 6,
wherein the distance along the first direction from the
electrodes to the first internal layer wirings is 0.5 mm
or greater, and
wherein the distance along the first direction from the
electrodes to the second internal layer wirings is 0.5
mm or greater.

8. The receptacle assembly according to claim 1, wherein
the through-opening is formed in a region on a side away
from the second electrode line with respect to the first
electrode line in the third direction and/or a region on a side
away from the first electrode line with respect to the second
electrode line in the third direction.

9. The receptacle assembly according to claim 3,
wherein the housing of the connector includes a protru-
sion protruding in the first direction, and
wherein the circuit board includes a recess, the protrusion
being fitted into the recess,
wherein the through-holes of the circuit board include a
through-hole arranged beside the first electrode line
along the second direction and a through-hole arranged
beside the second electrode line along the second
direction, and
wherein the recess of the circuit board is arranged
between, in the third direction, the through-hole
arranged beside the first electrode line and the through-
hole arranged beside the second electrode line.

10. The receptacle assembly according to claim 3,
wherein the connector includes a metal shell covering the
housing,
wherein the plurality of protruding parts are formed to the
shell,
wherein the housing includes a step on the outer circum-
ferential face, and
wherein an edge facing the circuit board of the shell is in
contact with the step of the housing.

11. The receptacle assembly according to claim 1 com-
prising a plurality of cages, at least one port to house the
external module being defined in each of the cages,
wherein the cages
are each fixed to the circuit board with the connector
mounted on the circuit board being housed in the cage,
and
are arranged with a spacing from each other in at least one
of the second direction and the third direction.

12. The receptacle assembly according to claim 4,
wherein the housing of the connector includes a protru-
sion protruding in the first direction, and
wherein the circuit board includes a recess, the protrusion
being fitted into the recess,
wherein the through-holes of the circuit board include a
through-hole arranged beside the first electrode line along the second direction and a through-hole arranged
beside the second electrode line along the second
direction, and
wherein the recess of the circuit board is arranged
between, in the third direction, the through-hole
arranged beside the first electrode line and the through-
hole arranged beside the second electrode line.

13. The receptacle assembly according to claim 4,
wherein the connector includes a metal shell covering the
housing,
wherein the plurality of protruding parts are formed to the
shell,
wherein the housing includes a step on the outer circum-
ferential face, and
wherein an edge facing the circuit board of the shell is in
contact with the step of the housing.

14. A circuit board configured such that an external
connector having a plurality of contact pins is mounted on
the circuit board and an external module is inserted into the
external connector along a first direction, the circuit board
comprising:
when a direction orthogonal to the first direction is
defined as a second direction, and a direction orthogo-
nal to the first direction and the second direction is
defined as a third direction,
a plurality of electrodes provided to a first face, each of
the contact pins being mounted on each of the elec-
trodes; and
a plurality of internal layer wirings formed in an internal
layer between the first face and a second face, which is
the backside of the first face, and connected to each of
the electrodes through a via,
a through-opening formed so as to penetrate from the first
face to the second face,
wherein the plurality of electrodes form a first electrode
line including electrodes aligned in a line along the
second direction and a second electrode line including
electrodes aligned in a line along the second direction
and arranged at a distance in the third direction from the
first electrode line,
wherein the plurality of internal layer wirings include a
plurality of first internal layer wirings connected to the
plurality of electrodes included in the first electrode
line and a plurality of second internal layer wirings
connected to the plurality of electrodes included in the
second electrode line,
wherein some of the plurality of first internal layer
wirings are drawn toward the second electrode line
when viewed in the first direction, and
wherein some of the plurality of second internal layer
wirings are drawn toward the first electrode line when
viewed in the first direction,
wherein the through-opening is a hole for guiding air that
has passed through a heat sink which removes heat
from the external module and flows along the first
direction to an external space adjacent to the second
face,
wherein the through-opening extends in the second direc-
tion to be parallel to the first electrode line and/or the
second electrode line in a region in which the internal
layer wirings are not formed.

* * * * *